United States Patent [19]
Consiglio

[11] Patent Number: 5,410,254
[45] Date of Patent: Apr. 25, 1995

[54] METHOD FOR OPTIMIZING THE STRUCTURE OF A TRANSISTOR TO WITHSTAND ELECTROSTATIC DISCHARGE

[75] Inventor: Rosario J. Consiglio, San Jose, Calif.

[73] Assignee: LSI Logic Corporation, Milpitas, Calif.

[21] Appl. No.: 26,558

[22] Filed: Mar. 4, 1993

[51] Int. Cl.$^6$ ............................................. G01N 27/60
[52] U.S. Cl. .................................... 324/456; 324/719; 324/158.1
[58] Field of Search ............... 324/158 R, 158 F, 452, 324/456, 719; 257/355; 307/443, 580

[56] References Cited

U.S. PATENT DOCUMENTS

| | | | |
|---|---|---|---|
| 4,636,724 | 1/1987 | Fukuda et al. | 324/158 R |
| 4,734,752 | 3/1988 | Liu et al. | 307/304 |
| 4,812,755 | 3/1989 | Toshiyuki et al. | 324/158 F |
| 4,823,088 | 4/1989 | Fukuda | 324/456 |
| 4,855,620 | 8/1989 | Duvvury et al. | 307/448 |
| 4,987,465 | 1/1991 | Longcor et al. | 361/91 |
| 5,132,612 | 7/1992 | Burns et al. | 324/158 F |
| 5,239,270 | 8/1993 | Desbiens | 324/719 |

OTHER PUBLICATIONS

Maloney et al, "Transmission Line Pulsing Techniques for Circuit Modeling of ESD Phenomena", EOS/ESD Symposium, Dec. 1985, pp. 49–54. (Intel Corporation).

*Primary Examiner*—Louis Arana
*Assistant Examiner*—Christopher M. Tobin
*Attorney, Agent, or Firm*—Honigman Miller Schwartz and Cohn

[57] ABSTRACT

The present invention relates to a system and method of quantitatively evaluating the amount of electrostatic discharge that integrated circuit field effect transistors may endure before material damage results thereto. The system and method utilizes a plurality of test devices, each having certain differences in structure, which are fabricated onto a common integrated circuit substrate for contemporaneous testing of each device under controlled quantitative conditions. The test results may be organized into a "matrix experiment". A matrix experiment comprises a set of experiments where the settings or values of several product or process parameters to be studied are changed from one experiment to another. An orthogonal matrix array may be utilized to enhance the reliability of the data analysis, and may effectively reduce the number of experiments necessary to establish a reliable conclusion from the limited number of tests performed.

5 Claims, 11 Drawing Sheets

METHOD FOR OPTIMIZING THE STRUCTURE OF A TRANSISTOR TO WITHSTAND ELECTROSTATIC DISCHARGE

BACKGROUND OF THE INVENTION

1. Field of the Invention

The present invention relates generally to semiconductor devices and integrated circuits and, more particularly, to a method of and system for optimizing integrated circuit active device structures for robustness against damage from electrostatic discharge while minimizing degradation of circuit performance.

2. Description of the Related Technology

Electrostatic charge was discovered by the early Greeks and was a novelty until electricity became better understood and more widely used. An electrostatic charge potential may become so large that the insulating medium between the positive and negative charges breaks down. This break down results in what is called "electrostatic discharge" or "ESD". Examples of minor and major ESD events are an electric spark from a metal door knob to one's finger after shuffling across a carpeted floor, and a lightning bolt between the earth and the clouds, respectively.

Electrical and electronic devices and systems are sensitive to ESD because insulation breakdowns, caused by ESD, may seriously degrade the electrical performance characteristics of the device or system. Electrical power systems are protected from ESD (lightning) by protective devices having voltage break down characteristics that short out and dissipate the ESD event before it can damage the electrical system insulation.

Electronic circuits have become more susceptible to ESD damage as the circuit elements have become smaller and the insulation thinner therebetween. During the age of vacuum tube technology, the vacuum tube device's operating voltages were hundreds or even thousands of volts, and the spacing between the device's elements were fractions of an inch. Today, devices in very large scale integrated circuits operate at three to five volts and have element and insulation dimensions of thousandths of an inch (microns).

With the micron element spacing of integrated circuit devices, even relatively small ESD events can be catastrophic. The electronics industry has addressed the ESD problem in various ways. One way is to add ESD protective devices into an electronic system so that all input and output lines are clamped below an ESD voltage that would damage the integrated circuits. Using an added ESD protective device, however, does not prevent integrated circuit ESD damage before the protective device is connected to the integrated circuit. Integrated circuit manufacturers have thus tried to incorporate some form of ESD protection into the integrated circuits themselves.

Various forms of ESD protective devices such as zener diodes, capacitors and other controlled break down or surge filtering devices have been used to protect integrated circuit input/output ("I/O") lines. These ESD protective devices, however, have high capacitance and degrade the high frequency signal performance of digital integrated circuits. In addition, the above types of ESD protective devices are large and expensive to implement during integrated circuit wafer fabrication.

The most sensitive devices requiring ESD protection in metal oxide semiconductor ("MOS) integrated circuity involve the operation of N-channel MOS ("NMOS") field effect transistors. The operation of NMOS field effect transistors in breakdown mode is called snapback because the drain-source voltage drops in the high current region. A more detailed explanation of NMOS snapback and testing integrated circuit devices with transmission line derived pulses is illustrated in Maloney, et al., *Transmission Line Pulsing Techniques for circuit Modeling of ESD Phenomena*, Intel Corporation, (1985 EOS/ESD Symposium).

An integrated circuit field effect transistor ("FET") having polysilicon over field oxide can sometimes produce a parasitic field that interferes with normal circuit operation. This parasitic field may be utilized to protect the field effect transistor structure from ESD damage. A guard ring may be utilized which surrounds the integrated circuit FET source, drain and gate elements. The guard ring, unlike zener diodes or capacitors, does not substantially degrade the high frequency performance of the FET.

Therefore, the guard ring, when properly designed, provides an easily implemented protective device without sacrificing normal operating performance of the FET circuit. The exact dimensions and robustness of the various elements of the FET, including the guard ring, however, are dependant on the integrated circuit fabrication process. Fortunately, the important dimensions for best ESD protection do not normally interfere with minimum circuit design rules. The structure for ESD protection, once determined, is not sensitive to variations in the integrated circuit wafer fabrication process.

Heretofore, the usual practice in designing ESD protection utilizing parasitic fields has been to use a heuristic methodology, i.e., hit and miss. What is desirable is a system and method of testing design criteria that leads to easily optimized dimensional values for the plurality of possible FET elements such as, for example, channel length, channel width, guard ring to drain distance, and drain contact to gate spacing.

SUMMARY OF THE INVENTION

Accordingly, for best ESD protection, an object of the present invention is to optimize the parasitics inherent in the structure of an integrated circuit FET device.

Another object of the present invention is to objectively determine optimal FET channel length, channel width, guard ring to drain distance, and drain contact to gate spacing in accordance with the principles of Taguchi experimental design, as more fully described in Phadke, *Quality Engineering Using Robust Design*, Prentice Hall, 1989.

Another object of the present invention is to utilize a transmission line pulser for sensitive qualitative and repeatable testing for determining optimal ESD protective device parameters resulting in FET layout dimensions compatible with good ESD design practice, and with relatively little impact on the performance of existing integrated circuit designs.

Still another objective of the present invention is to utilize software programs for determining various ESD protective device signal to noise ratios, in accordance with Taguchi experimental design for selection of optimal parameters therefrom.

The above and other objects of the present invention are satisfied, at least in part, by providing a test integrated circuit having a plurality of devices to be tested, each device having a combination of elements that have at least one dimension of an element different from those elements associated with the other devices of the test integrated circuit.

In accordance with a preferred embodiment of the invention, an integrated circuit ESD test structure is used to optimize integrated circuit element dimensions for optimal ESD protection without materially degrading normal circuit performance. Conventional unipolar devices such as, for example, NMOS devices are used in a BVDss break down test configuration. A transmission line pulse generator is utilized to obtain quantitative data representing the break down characteristics of each test device. The gate of each test device may be connected to the respective drain as an additional test configuration.

Each test device in the preferred embodiment of the invention comprises an insulated gate field effect transistor fabricated on a semiconductor integrated circuit substrate. As an example, a plurality of NMOS FET test devices, fabricated on a P-well substrate, each device comprising an N-channel source, an N-channel drain, a polysilicon gate insulated by a field oxide, and a P-channel guard ring surrounding the source, gate and drain elements. Five variable parameters, each having three possible values, are utilized for computing using the Taguchi design technique. These five variable parameters are: (1) channel length, (2) width, (3) drain contact to gate spacing, (4) P+ guard ring in P-well to N+ island/drain diffusion, and (5) drain contact island enclosure. These variables and their test values are illustrated in Table 1 below.

The transmission line pulse generator comprises a coaxial transmission line terminated into a polarized matched load having a characteristic impedance of the transmission line. The coaxial transmission line is charged to a high voltage potential from a voltage source having high impedance. The coaxial cable end opposite the matched load is then connected to the device under test. The resulting high voltage pulse waveform and amplitude are highly predictable and repeatable. The pulse amplitude is equal to the voltage source amplitude. The pulse waveform is a square wave having a pulse width determined by the length of the coaxial cable.

Each device is contemporaneously tested with the above mentioned transmission line pulse generator and the test results recorded in matrix form. The test results matrix comprises data from all the tests performed on each of the test devices. The data in the matrix taken together is analyzed to determine the effects of the various variable parameters. The method of the present invention uses orthogonal arrays as the matrix. Use of an orthogonal array allows the effects of the various parameters to be evaluated efficiently and simply. These resulting effects become factors in determining the most robust design for a given experiment.

The example above requires a matrix having 18 rows and five columns. Each row represents an individual test device having a unique set of parameters defined in each column. The result of interest for each experiment is the maximum device current or maximum device voltage at which each test device fails. The larger the device current or voltage value, the less susceptible the device is to ESD. The device current or voltage value at which the device fails under test is the quality characteristic, and preferably is as high as possible without degrading the operating performance of the integrated circuit. The quality characteristic for each experiment (row) may be defined as the reciprocal of the device failure current or voltage level squared. A general formula for n experiments represented by n rows in the matrix is:

$$\eta = -10 \log_{10} \text{(mean square reciprocal quality characteristic)}$$
$$= -10 \log_{10} \left( \frac{1}{n} \sum_{i=1}^{n} \frac{1}{y_i^2} \right).$$

A signal to noise ratio of each experiment may be defined as:

$$S/N \text{ Ratio} = -10 \log \text{(Quality Factor)}$$

The more positive, i.e., value closer to zero, the S/N ratio, the better the device is in withstanding an ESD event.

From the S/N ratios determined above, the optimum factor settings from the collection of all test parameters may be readily chosen for best ESD withstand. The chosen parameters may then be implemented into production integrated circuits quickly and economically.

A feature of the present invention is utilization of a transmission line pulse generator having pulse amplitude and timing that is constant and highly repeatable.

An advantage of the present invention is being able to test a plurality of devices made from a common process contemporaneously with a transmission line pulse generator that allows uniform and repeatable testing of each device.

Another feature of the present invention is evaluation of the test results using computer programs that process the test data into easily usable information that may be further utilized in optimizing the device parameters through Taguchi robust design criteria evaluation.

A further advantage of the present invention is evaluating the test results in an orthogonal matrix to determine the optimum set of parameters for best signal to noise ratio of the device qualities desired.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

The present invention is a system and method for easily and quickly determining and organizing test data so that the ESD robustness of various different NMOS FET structures on a common semiconductor integrated circuit substrate may be determined. The present invention utilizes a transmission line pulser that enables collecting high resolution test data using its highly repeatable output for generating ESD related test data. This test data is evaluated in a matrix form for determining layout dimensions of NMOS FET devices of an integrated circuit for maximum ESD robustness without sacrificing operating performance of the devices. Existing integrated circuit designs may be tested with the present invention, and ESD robustness may be verified or improved using the system and method of the present invention.

Figure 1:
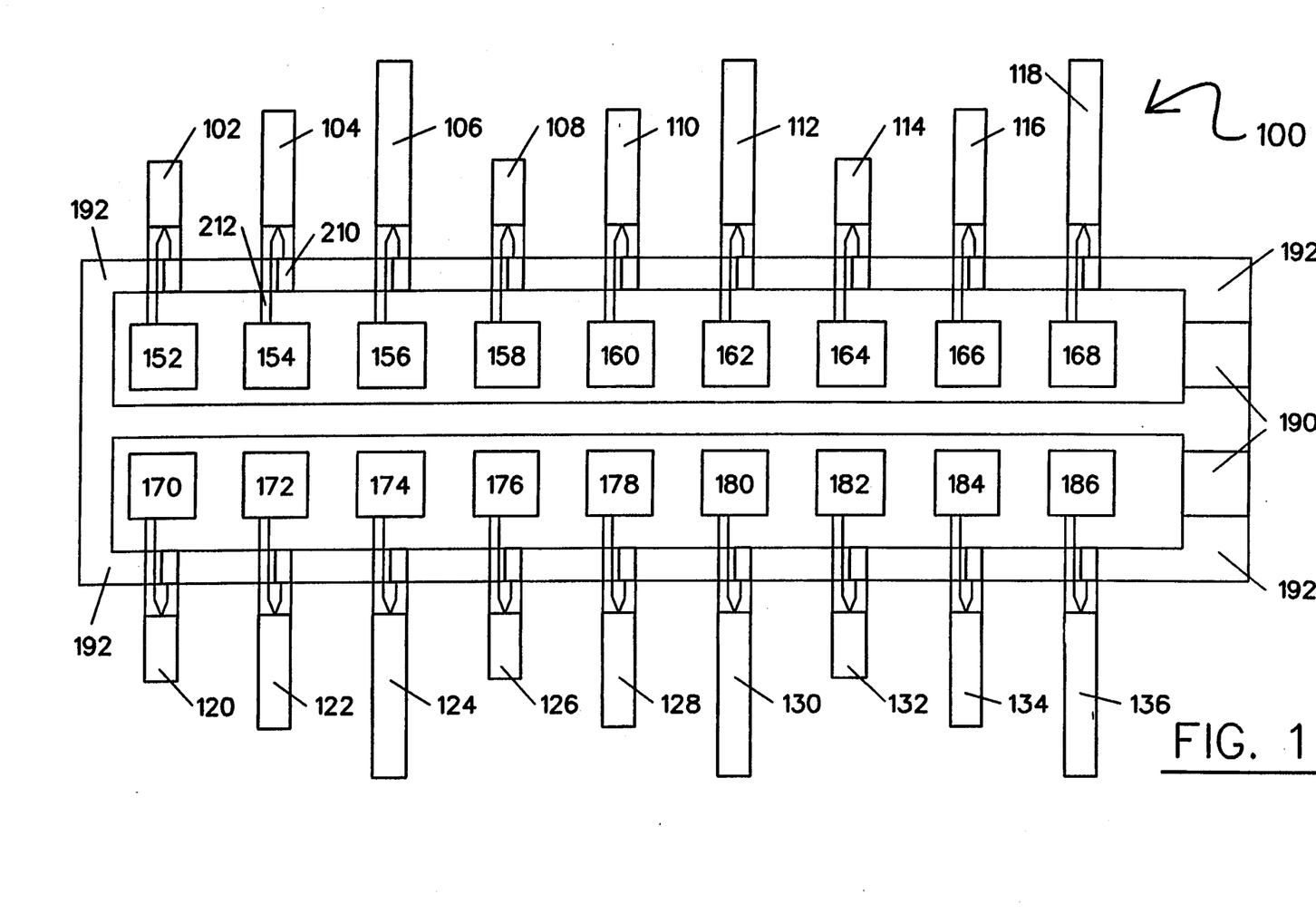
FIG. 1 is a schematic plan view of a preferred embodiment of the ESD test structure.

Referring now to FIG. 1, a test structure of the present invention is illustrated in schematic plan view. A semiconductor integrated circuit test chip 100 is fabricated, using a desired process and having a plurality of NMOS FET test devices 102 through 136. Each NMOS FET device has at least one different design parameter relating to the NMOS device ESD robustness and operating performance.

Figure 2:
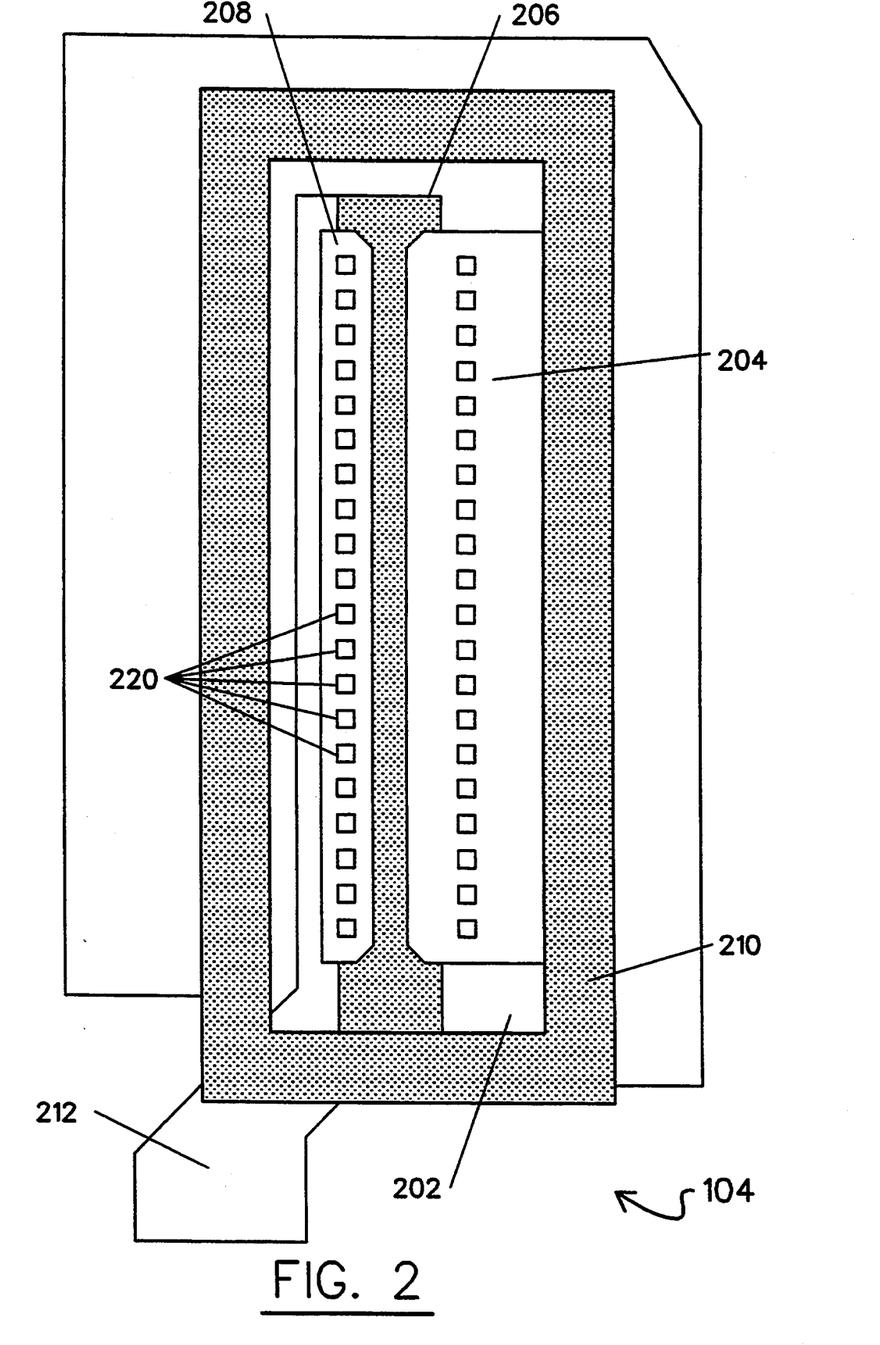
FIG. 2 is a schematic plan view of one test device of the ESD test structure of FIG. 1.

Referring now to FIG. 2, the device 104 of the test chip 100 is illustrated in magnified schematic plan view. The device 104 comprises a guard ring 202, a source 204, a gate 206, a drain 208, and metal conductors 210 and 212. Contact pads 220 are utilized to connect guard ring 202, source 204 and gate 206 to contact 210, and drain 208 to contact 212.

Figure 3:
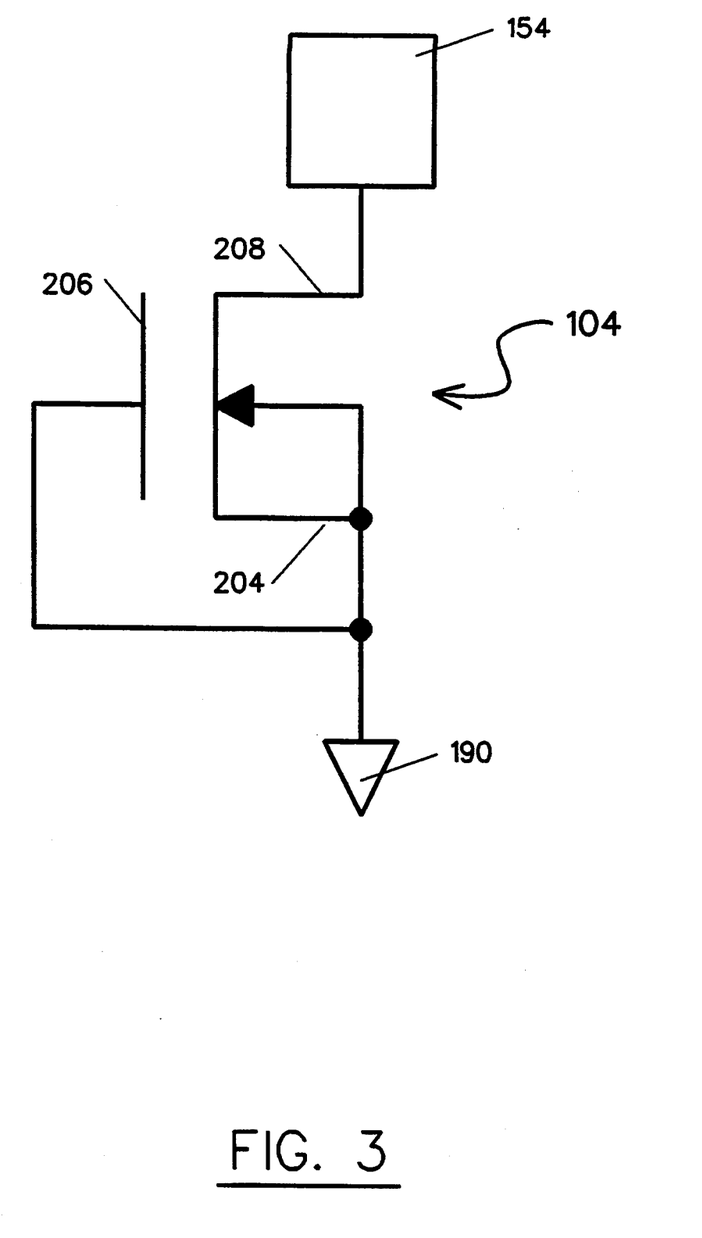
FIG. 3 is an electrical schematic diagram of the test device illustrated in FIG. 2.

The interconnection of the elements of the NMOS FET device is illustrated schematically in FIG. 3. Each device 102 through 136 has its source and gate connected together. Connecting the FET elements in this manner reduces the number of external connections required for testing purposes. A common connection between the gate and source, both connected to ground or the negative supply voltage, with the drain normally isolated from the source and connected to the positive supply voltage, is a well known and standard test configuration for NMOS FET devices.

The gate 206 is connected to the source 204 as illustrated schematically in FIG. 3. The drain 208 is connected to a test contact 154 by conductor 212, and the source 204 and gate 206 connect to common test contacts 190 (FIG. 1) by conductor 210 and common ground bus 192.

Figure 4:
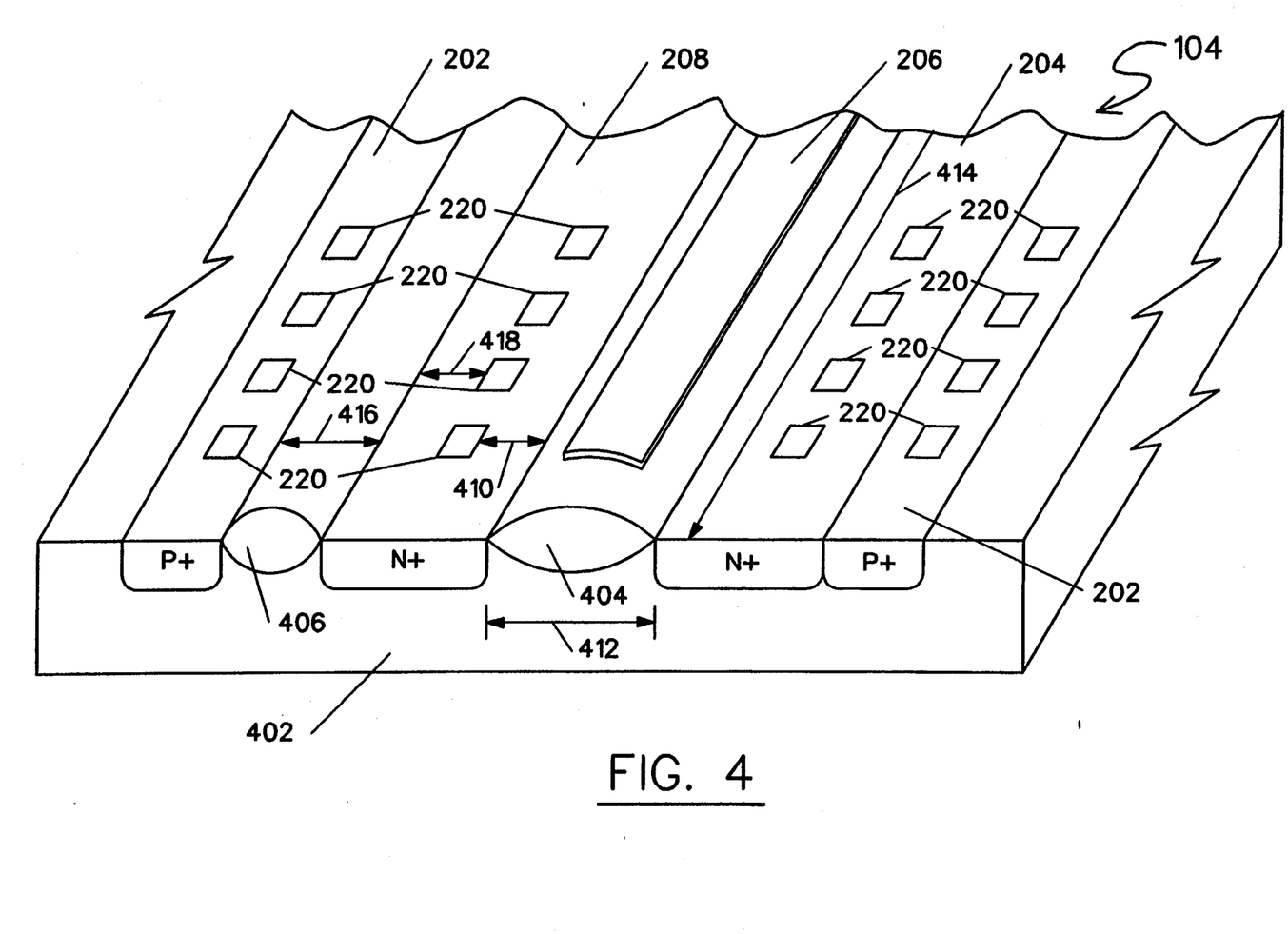
FIG. 4 is a schematic isometric diagram of the structure of the test device illustrated in FIG. 2.

Referring now to FIG. 4, test device 104 is illustrated in a schematic orthogonal view. A cross section of a typical NMOS FET is illustrated. The device 104 is fabricated into a P-well integrated circuit substrate 402. The guard ring 202 encircles the source 204, gate 206 and drain 208 (FIG. 2). The gate 206 is insulated from the substrate 402, source 204 and drain 208 by a field oxide layer 404. The drain 208 is insulated from the guard ring 202 by field oxide layer 406. Using the NMOS FET structure illustrated in FIGS. 2 and 4, the present invention utilizes dimensionally different structures for testing the ESD robustness of each test device.

The purpose of the system and method of the invention is to obtain test data on the performance of the devices, each having dimensionally different structures, and how the combination of different device specific structures affects the ESD robustness of each particular device. The specific device structure dimensions are: (1) the distance from drain 208 contact 220 to gate 206 oxide 404 edge is spacing 410, (2) the channel length 412 is the distance between the source 204 and the drain 208, (3) the overall device width is represented by width 414, (4) the distance between guard ring 202 and drain 208 is spacing 416, and (5) the distance between the drain 208 contact 220 and the oxide 406 edge is spacing 418.

Figure 5:
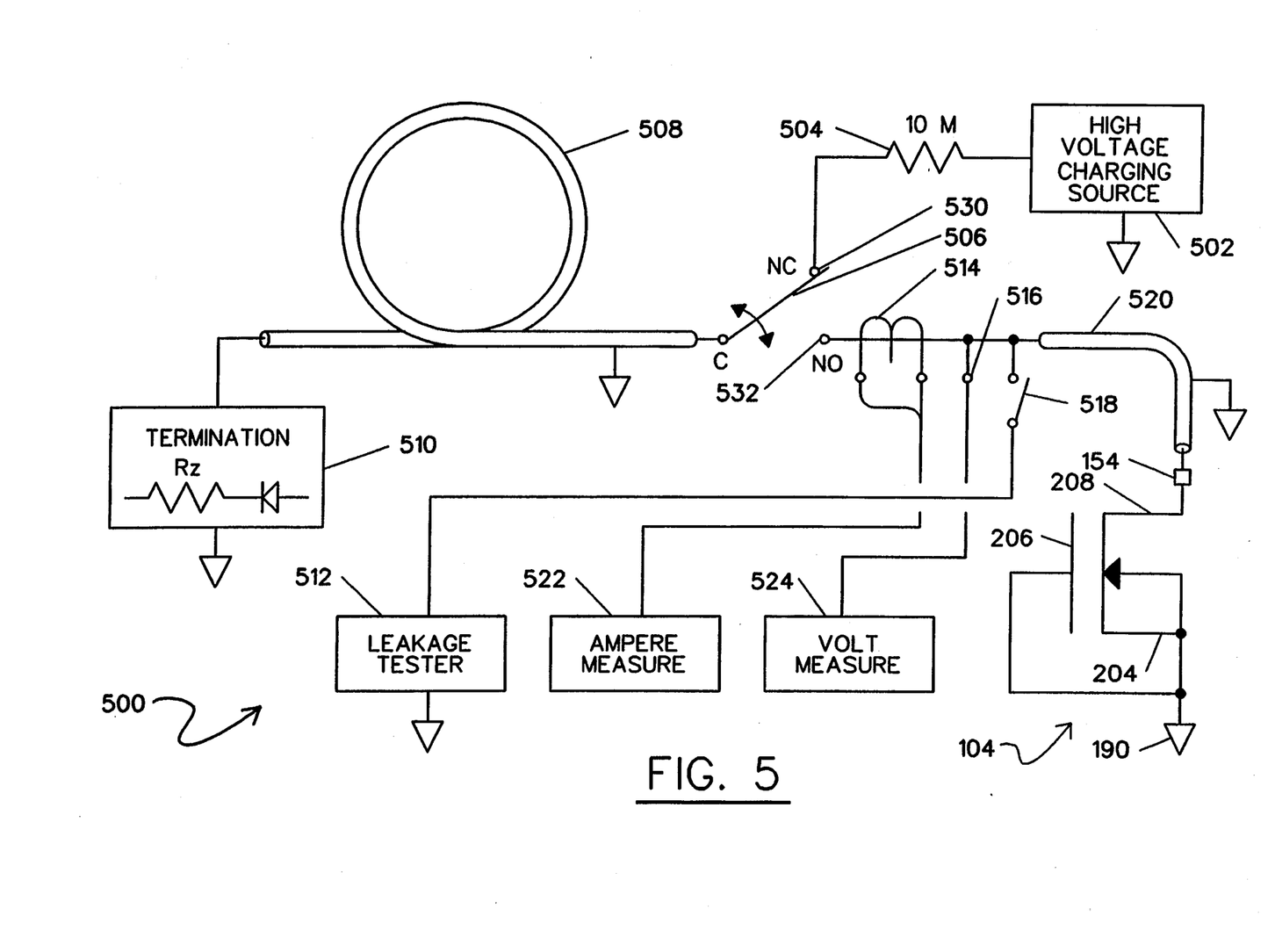
FIG. 5 is a schematic block diagram of a preferred embodiment of the ESD testing system of the present invention.

Referring now to FIG. 5, a system for testing each device for ESD robustness is illustrated in schematic block diagram. The device 104 under test is connected to a transmission line pulse generator and leakage testing system 500. The pulse generator and leakage testing system 500 comprises a pulse generator having a high voltage source 502, series resistor 504, relay switch 506, transmission line energy storage means 508, and termination resistor 510. The system 500 also comprises a leakage tester 512, current measuring transducer 514, voltage test point 516, leakage tester switch 518, and connection means 520.

The pulse generator of the system 500 is adapted to generate a pulse having a specific pulse time and constant amplitude during the pulse time. The pulse generator of the system 500 accomplishes this by adjusting the length of the transmission line 508 for a specific pulse time. The pulse amplitude is determined by the voltage available from voltage source 502. The termination resistor 510 is connected in series with a diode that prevents current flow through the resistor 510 during charging of the transmission line 508, thus, the voltage source 502 sees a very high impedance at the connection made by the relay switch 506 when in its normally closed position. The transmission line 508, which is a distributed capacitance, charges to the full voltage potential available from the voltage source 502.

When relay switch 506 switches from its normally closed position 530 to its normally open position 532, the stored energy in the transmission line 508 is connected to the device 104 under test through connection means 520. The device 104 under test has a finite resistance to the voltage from the transmission line 508 and the energy stored therein is dissipated into the device 104. Current flow in the circuit comprising the series connection of the termination resistor 510, transmission line 508 and device 104 causes the diode in the termination 510 to be forward biased, thus the transmission line "sees" its characteristic impedance of Rz. The terminated transmission line produces a pulse having substantially constant amplitude during the pulse duration time. This greatly facilitates calculating the device current, voltage and failure energy of the device under test when determining best device ESD robustness.

The current measuring transducer 514 is connected to a current measuring and recording device 522. The voltage test point is connected to a voltage measuring and recording device 524. Measuring devices 522 and 524 are used to measure and record the device 104 current-voltage ("I-V") characteristics during the pulse event. The leakage test 512 and switch 518 are used to determine the device leakage before pulse testing, and after a pulse event through the device 104.

ESD Robustness Design Methodology

Figure 6:
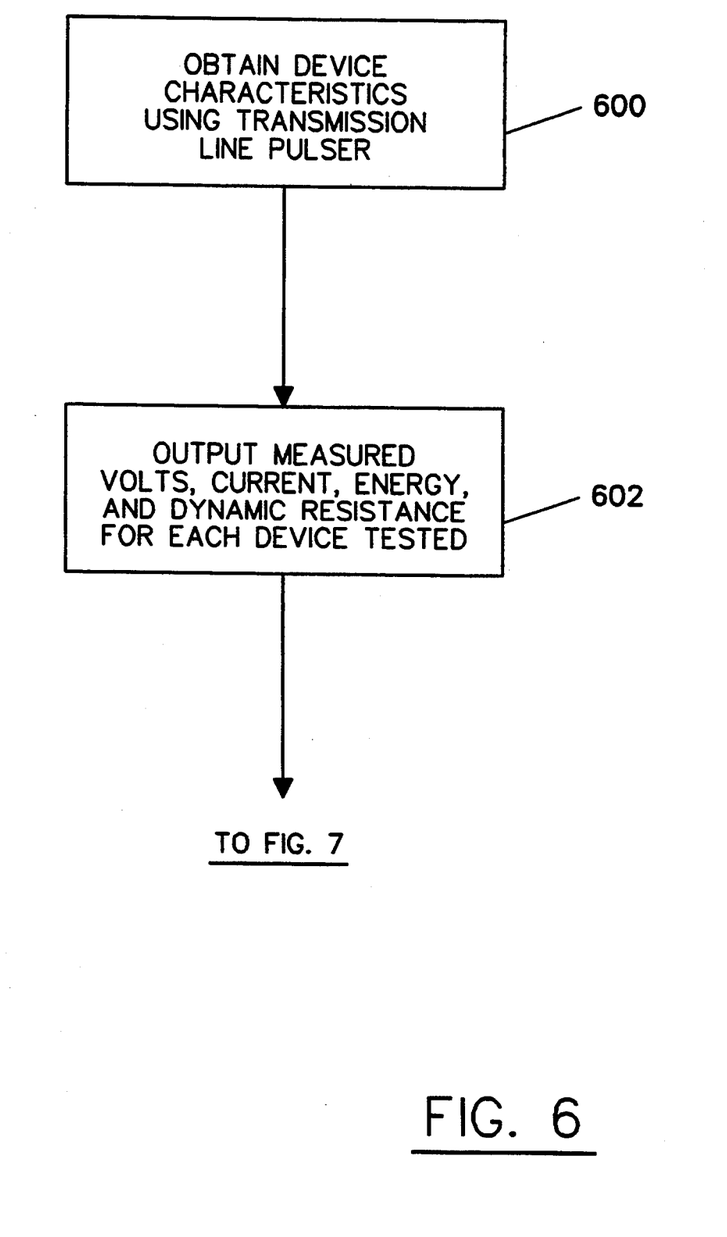
FIGS. 6 and 7 are schematic flow diagrams for a method of testing ESD robustness of the test structure of FIG. 1.
Figure 7:
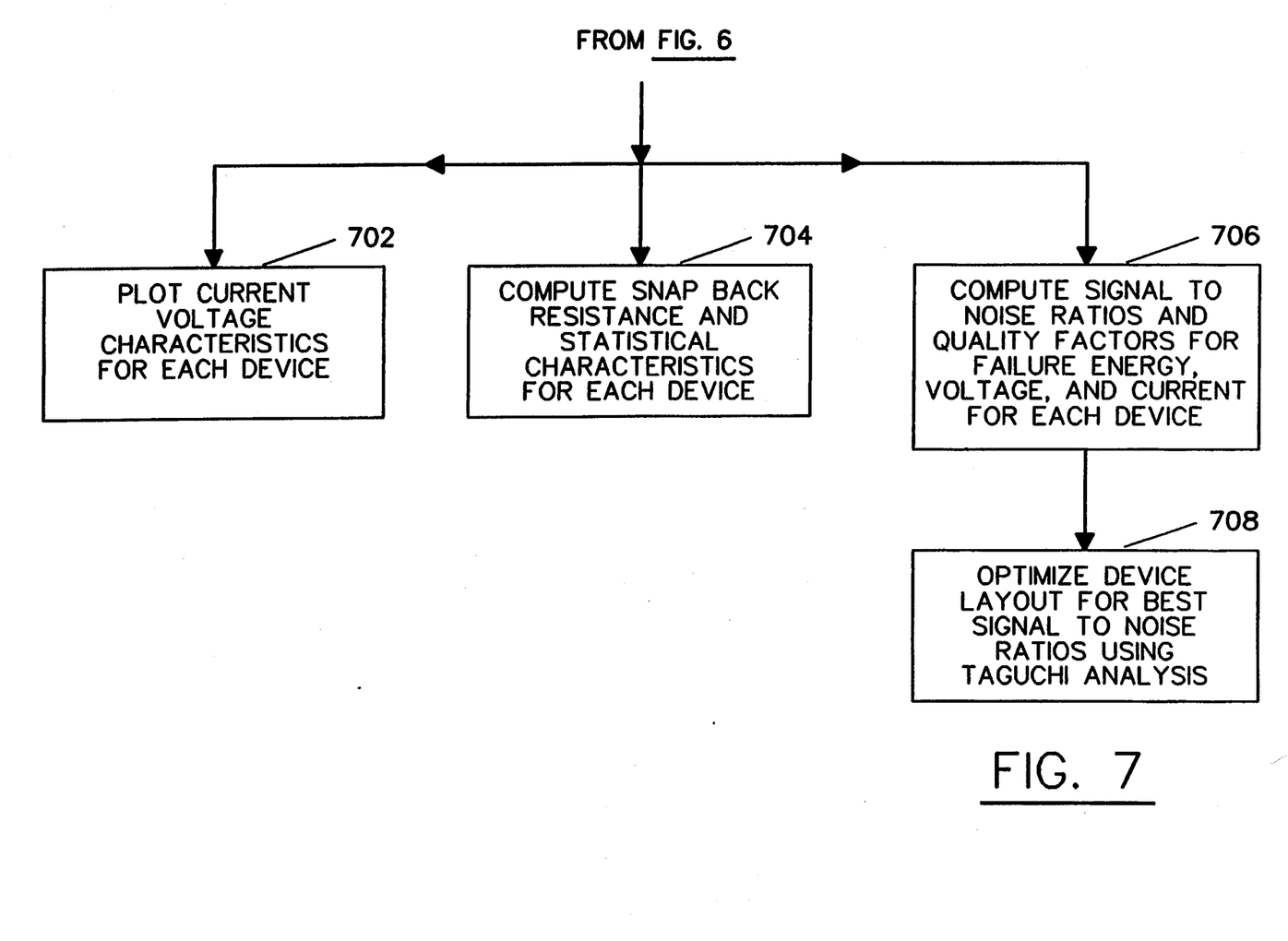

Referring to FIGS. 6 and 7, a flow diagram of a preferred embodiment of the method of the present invention is illustrated schematically. In step 600, the characteristics of the device under test is obtained by utilizing a transmission line pulser. During the pulse event, the device volts, current, energy dissipated, and dynamic resistance are either directly measured or calculated as represented by step 602. Once the aforementioned data is obtained for each device under test, various plots and further calculations may be performed.

Step 702 depicts the plotting capability of the system for displaying the voltage and current characteristics for each device tested. Step 704 indicates the ability to compute the snapback resistance and other statistical characteristics for each device tested. Step 706 depicts computing the signal to noise ratios and quality factors for each device under test. These signal to noise ratios are utilized in the Taguchi analysis for determining the device structure having the most robust ESD withstand without substantially degrading normal operating performance, as represented by step 708.

Device Characterization Testing for ESD Robustness

Figure 8:
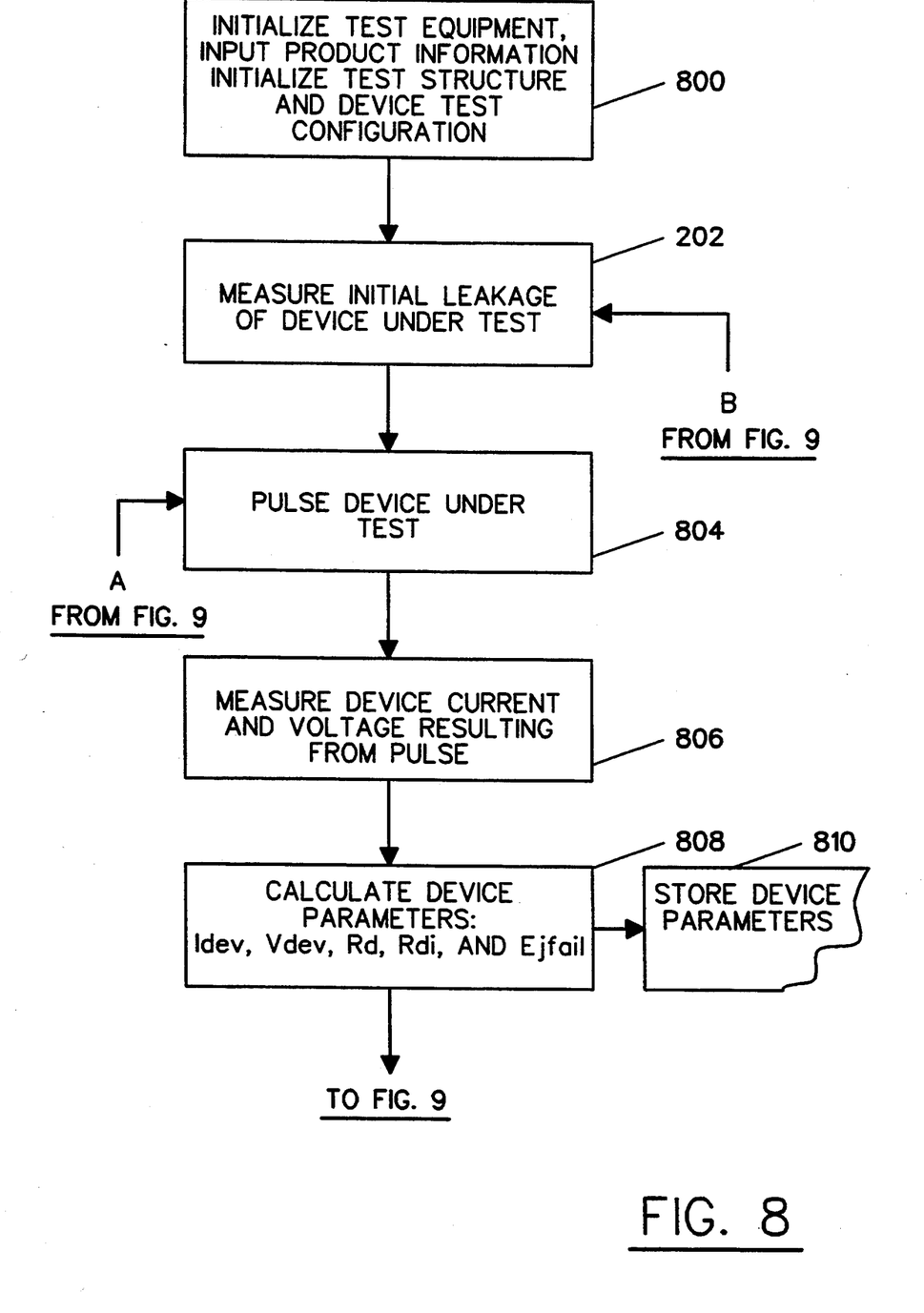
FIGS. 8 and 9 are schematic flow diagrams for a method of determining device parameters during testing using a transmission line pulse generator.
Figure 9:
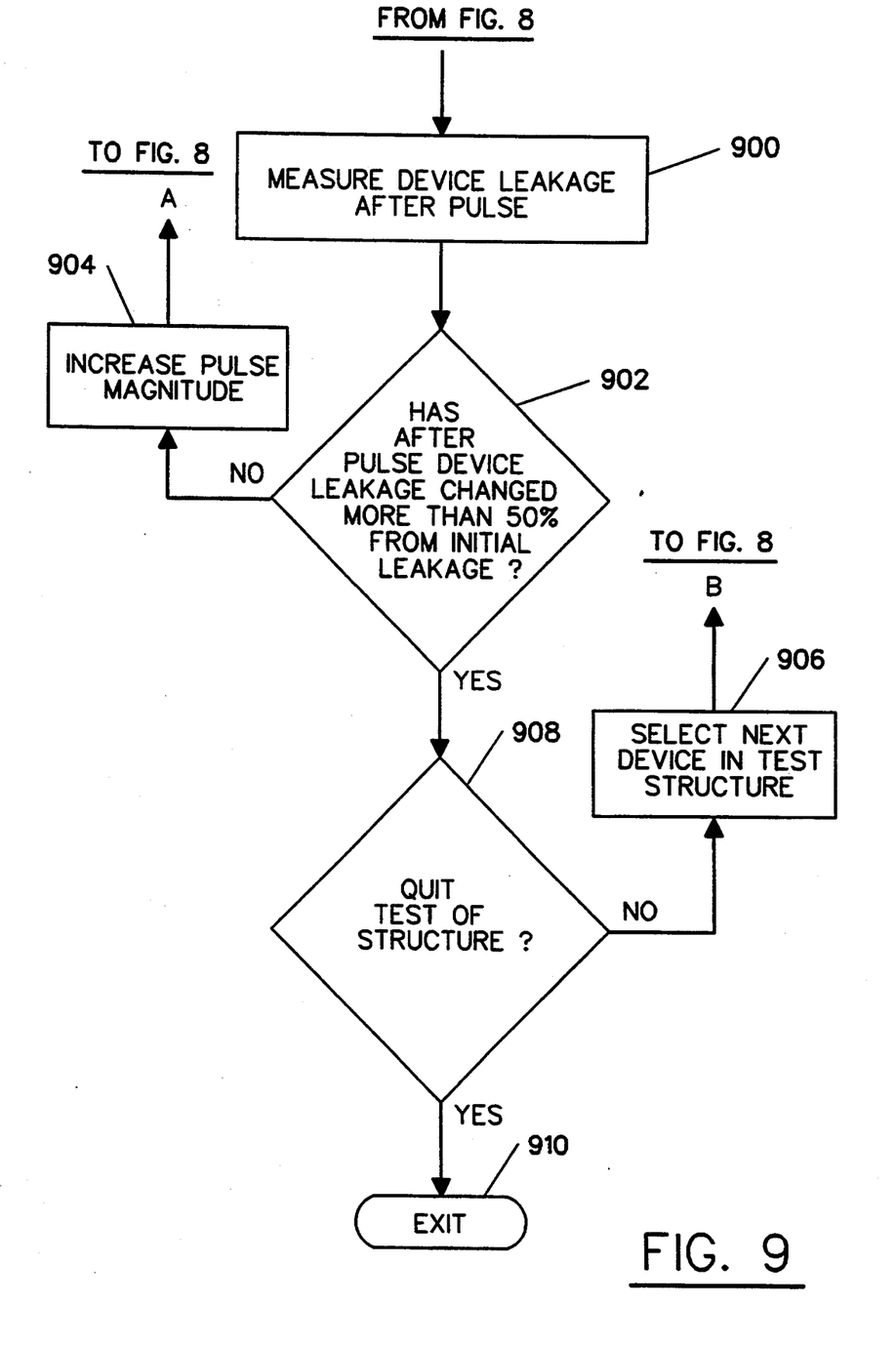

Referring now to FIGS. 8 and 9, a flow diagram of the procedure for testing the devices is illustrated schematically. Step 800 represents initializing the test equipment (System 500 of FIG. 5), identifying the product being tested, initializing the test structure containing the ESD test device 100 (FIG. 1), and defining the device to be tested. In step 802, the leakage current of the device to be tested is measured and recorded. This initial leakage measurement is used as a base line for comparison to subsequent leakage measurements of the device under test after sustaining an energy pulse representative of an ESD event.

Step 804 represents the transmission line 508 being charged up to a selected potential from voltage source 502 (FIG. 5), and relay switch 506 causing the pulse to be applied to the device 104 under test. Step 806 represents the measurement of the current and voltage characteristics of the device 104 being tested. Sensors 514 and 516 in conjunction with measuring devices 522 and 524, respectively, enable real time data acquisition of the device during the pulse event. In step 808, a digital computer may be used to calculate from the measured currents and voltages of the device under test, various parameters such as, for example, device terminal current leakage, $I_{dev}$; device terminal voltage, $V_{dev}$; dynamic resistance, $R_d$; dynamic resistance using current waveform reflection coefficients, $R_{di}$; and junction failure energy, $E_j$ fail. Step 810 stores these calculated device parameters for subsequent use by other program features of the present invention.

Step 900 measures the device leakage after the pulse event. Decision step 902 determines whether the device leakage has changed more than 50% from the initial leakage measurement made before pulsing the device. If the subsequent pulse event device leakage has not changed more than 50%, then the magnitude of the next pulse is increased in step 904. The device is pulsed again, with the greater magnitude pulse, in step 804. All subsequent steps 806 to 902 are performed as mentioned above. The pulse amplitude continues to be increased until the device leakage has changed more than 50%, then testing of the device is finished.

A device is tested until the energy from the pulse event is of sufficient magnitude to damage the device sufficiently that its characteristics are degraded below acceptable tolerances. Unacceptable degradation is represented by device leakage increasing by more than 50%. Decision step 908 determines if there are any untested devices remaining in the test structure 100 (FIG. 1), if so, step 906 begins a new test at step 802 for the untested device.

The system and method of the present invention may manually switch between devices on the test structure by moving connection means 520 (FIG. 5) between any one of the test connections 152 through 184 (FIG. 1), or an automated switching means may be employed to automatically, under computer control, switch the system 500 to each of the devices 102 through 136 of the ESD test structure 100. One skilled in the art of testing and automation will readily understand how to automate successive device testing, the merits and implementation thereof. Once all of the devices have been tested, the test results calculated and stored by steps 808 and 810, respectively, the test program terminates at exit step 910.

Data Reduction and Further Calculations from Raw Test Data

Data recorded for each device during pulse testing may be further utilized in characterizing the ESD robustness of each device having a unique structure. This further manipulation of the recorded data aids in selecting the device structure having the best ESD robustness without unacceptable degradation of the operating characteristics of the device.

Figure 10:
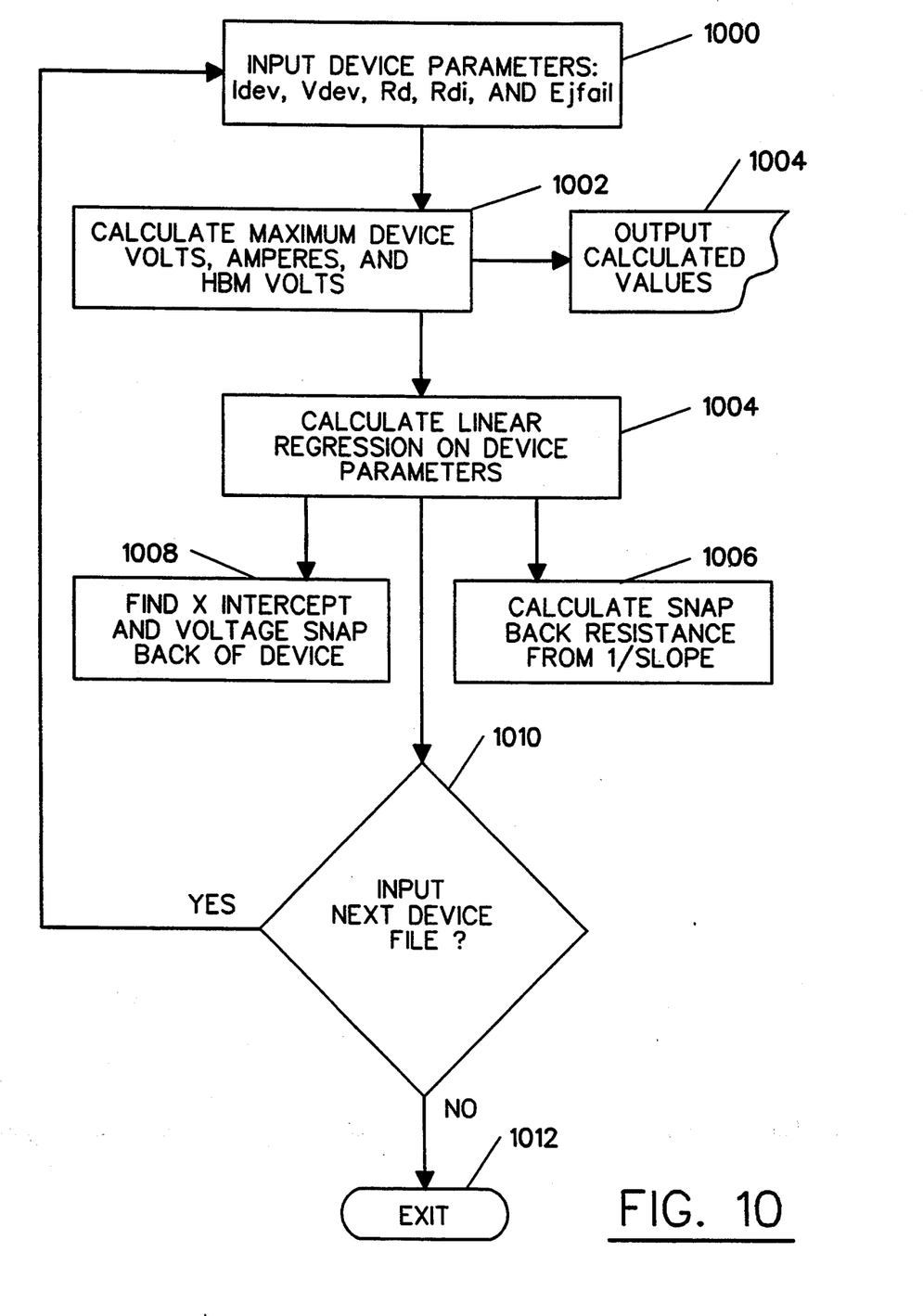
FIG. 10 is a schematic flow diagram for a method of manipulating data taken during the method of testing illustrated in FIGS. 8 and 9.

Referring to FIG. 10, the parameters derived from step 808 and stored during step 810 may be utilized by step 1000 to input this data into step 1002 where the device's maximum volts, amperes and human body model ("HBM") volts may be calculated for each device tested. After the calculations of step 1002 are complete, the results may be saved in step 1004 and input to step 1006 for further calculation of the linear regression of each of the device's parameters. From the linear regression calculations performed in step 1004, step 1006 calculates device snapback resistance from the reciprocal of the I-V slope of the respective device. In addition, step 1008 finds the x intercept point and snapback voltage of the device. These calculations continue for each device tested. Step 1010 determines whether all of the devices tested have had their respective data input by step 1000 and, if not, control is returned to step 1000 for further inputing of device parameters. When all device parameters have been input by step 1000 and the above calculations performed thereto by steps 1002, 1004, 1006 and 1008, then step 1010 causes the program to exit at step 1012.

Evaluating the Test Structure for Optimal Characteristics

The ESD test structure illustrated in FIG. 1 comprises a plurality of devices to be tested. Each one of the devices is different from the other devices. In the preferred embodiment illustrated in FIG. 1, the structure of each NMOS FET has at least one difference in a dimension of an aspect of the device. Each of the various structural differences affects the ESD robustness of the device. The purpose of the system and method of the present invention is to logically and quantitatively evaluate the differing results obtained from the various structurally different devices tested.

These test results may be organized into what is called a "matrix experiment". A matrix experiment comprises a set of experiments where the settings or values of several product or process parameters to be studied are changed from one experiment to another. An orthogonal matrix array may be utilized to enhance the reliability of the data analysis and may effectively reduce the number of experiments necessary to establish a reliable conclusion. See chapters 3 and 5, Phadke, *Quality Engineering Using Robust Design*, Prentice Hall (1989), incorporated herein by reference for all purposes.

The preferred embodiment of the present invention comprises eighteen poly silicon gate thick oxide NMOS transistors with the respective gates tied to the respective sources. Sources are butted to the P+well contact diffusion. The experiment is based on the Taguchi methodology with five variables comprising: channel length (0.8, 1.8, and 2.8 microns), channel width (30, 75, and 120 microns), drain contact to gate spacing (0.8, 2.9, and 5.0 microns), P+ guard ring in P-Well to N+ island/drain diffusion (0.8, 4.4, and 8.0 microns), and drain contact island enclosure (0.8, 2.4 and 4.0 microns). The tests use positive voltage to the NMOS FET drain and the gate/source/body terminals are grounded. A table of values is illustrated below.

TABLE 1

| Name | Drain Contact Spacing | Channel Length | Width | Guardring Island Spacing | Drain Contact Enclosure |
|---|---|---|---|---|---|
| PTFO1 | 0.8 | 0.8 | 30 | 0.8 | 0.8 |
| PTFO2 | 2.9 | 0.8 | 75 | 4.4 | 2.4 |
| PTFO3 | 5 | 0.8 | 120 | 8 | 4 |
| PTFO4 | 0.8 | 1.8 | 30 | 4.4 | 2.4 |
| PTFO5 | 2.9 | 1.8 | 75 | 8 | 4 |
| PTFO6 | 5 | 1.8 | 120 | 0.8 | 0.8 |
| PTFO7 | 2.9 | 2.8 | 30 | 0.8 | 4 |
| PTFO8 | 5 | 2.8 | 75 | 4.4 | 0.8 |
| PTFO9 | 0.8 | 2.8 | 120 | 8 | 2.4 |
| PTFO10 | 5 | 0.8 | 30 | 8 | 2.4 |
| PTFO11 | 0.8 | 0.8 | 75 | 0.8 | 4 |
| PTFO12 | 2.9 | 0.8 | 120 | 4.4 | 0.8 |
| PTFO13 | 2.9 | 1.8 | 30 | 8 | 0.8 |
| PTFO14 | 5 | 1.8 | 75 | 0.8 | 2.4 |
| PTFO15 | 0.8 | 1.8 | 120 | 4.4 | 4 |
| PTFO16 | 5 | 2.8 | 30 | 4.4 | 4 |
| PTFO17 | 0.8 | 2.8 | 75 | 8 | 0.8 |
| PTFO18 | 2.9 | 2.8 | 120 | 0.8 | 2.4 |

All values in Table 1 are in microns. PTFO1 through PTFO18 represent the NMOS FETs 102 through 136, respectively, illustrated in FIG. 1.

Figure 11:
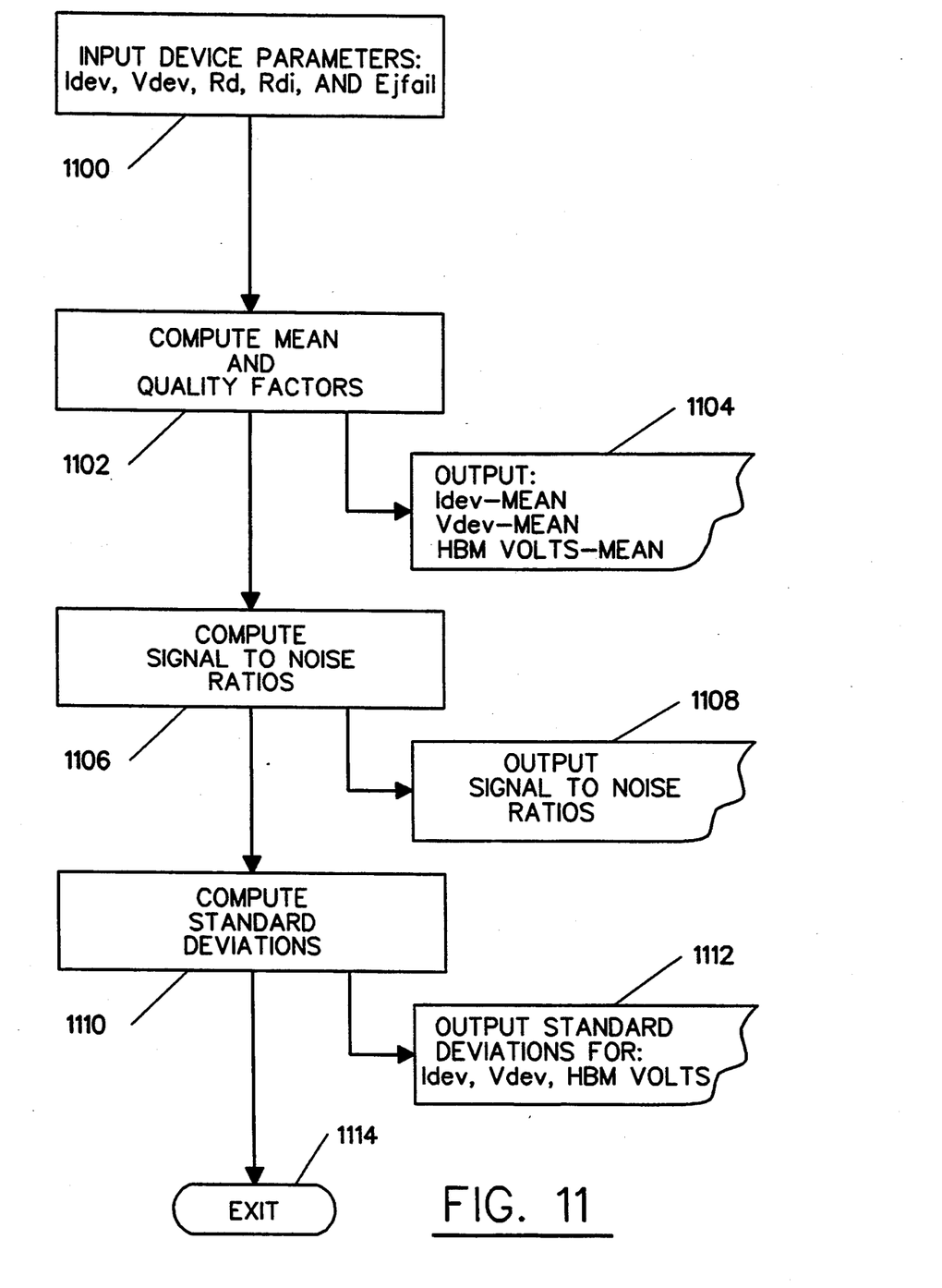
FIG. 11 is a schematic flow diagram for a method of computing signal to noise ratios for analyzing the robustness of the various test device structures to ESD.

Referring now to FIG. 11, a flow diagram of a method to compute signal to noise ratios for optimizing ESD robustness of a device structure utilizing the Taguchi analysis is illustrated schematically. Step 1100 inputs stored test data for each device from step 810 (FIG. 8). In step 1102, the inputed data from step 1100 is utilized to compute the mean and quality factors represented by $I_{dev\ mean}$, $V_{dev\ means}$ and $HBM_{volts\ mean}$. These calculated values are output in step 1104.

The quality factors from Taguchi analysis may be represented by:

$$\text{Quality factors:} \ (E_j \text{ fail}) = \frac{1}{n} \sum_{i=1}^{n} \frac{1}{(E_j \text{ fail}_i)^2}$$

$$I_{dev} = \frac{1}{n} \sum_{i=1}^{n} \frac{1}{(I \text{ device}_i)^2}$$

where the signal to noise ratio ("S/N ratio") is:

$$S/N \text{ Ratio} = -10 \log (\text{Quality factor}).$$

In the present case, when the S/N is closer to zero, i.e., less negative, the better the device is in withstanding an ESD event.

In step 1106, the signal to noise ratios are computed from the quality factors derived from $I_{dev}$ and $E_j$ fail and calculated as described above. The S/N ratios for each device are output by step 1108. Standard deviations are computed for $I_{dev}$, $V_{dev}$ and $HVM_{volts}$ in step 1110 and output in step 1112. After the above mentioned calculations have been completed, step 1114 exits the computer program.

The present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for determining an optimal structure for an insulated gate field effect transistor on a semiconductor integrated circuit that best resists damage from electrostatic discharge, said method comprising the steps of:
   (a) Initializing test equipment with specific test conditions for testing a plurality of insulated gate field effect transistors on a semiconductor integrated circuit, each of the insulated gate field effect transistors having at least one different structural dimension than the other field effect transistors;
   (b) measuring a first leakage current of each of the field effect transistors;
   (c) pulsing each of the field effect transistors with a pulse having a predefined voltage amplitude and time duration;
   (d) measuring a plurality of current and voltage values of each field effect transistor during its respective pulse;
   (e) calculating dynamic resistance for each field effect transistor from the respective measured plurality of current and voltage values;
   (f) measuring a second leakage current of each field effect transistor after pulsing the field effect transistor;
   (g) storing the plurality of current and voltage values, dynamic resistance, and first and second leakage currents of each field effect transistor;
   (h) increasing the pulse voltage amplitude and repeating steps (c) through (h) for each field effect transistor until the measured second leakage current of each of the field effect transistors changes a predetermined amount, then storing each of the last measured pulse voltage amplitude values for each field effect transistor as a failure voltage value for the respective field effect transistor; and (i) selecting the field effect transistor having the highest failure voltage value in order to determine an optimal field effect transistor structure resistant to damage from electrostatic discharge.

2. The method of claim 1, further comprising the steps of:

computing for each field effect transistor maximum volts, amperes and human body model volts;

computing for each field effect transistor snapback voltage and snapback resistance; and storing the computed maximum volts, amperes, human body model volts, snapback voltage and snapback resistance for each field effect transistor.

3. The method of claim 1, further comprising the steps of:

computing the current mean, voltage mean, and human body model volts mean for each field effect transistor;

computing a quality factor for each field effect transistor; and computing a signal to noise ratio for each test device using the respective quality factor of each field effect transistor.

4. The method of claim 1, wherein step (h) increases the amplitude of the pulse until the measured second leakage current changes fifty percent from the measured first leakage current for each field effect transistor.

5. The method of claim 1, wherein the stored measured values are arranged in an orthogonal matrix array.

* * * * *